United States Patent
Palanduz

(12) United States Patent (10) Patent No.: US 7,221,050 B2
Palanduz (45) Date of Patent: May 22, 2007

(54) SUBSTRATE HAVING A FUNCTIONALLY GRADIENT COEFFICIENT OF THERMAL EXPANSION

(75) Inventor: A. Cengiz Palanduz, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 10/933,898

(22) Filed: Sep. 2, 2004

(65) Prior Publication Data

US 2006/0043567 A1 Mar. 2, 2006

(51) Int. Cl.
*H01L 23/12* (2006.01)
*H05K 1/03* (2006.01)

(52) U.S. Cl. .................. 257/701; 257/724; 257/758; 257/774; 257/E23.011; 257/E23.145; 174/255; 174/262; 174/264

(58) Field of Classification Search .................. None
See application file for complete search history.

(56) References Cited

U.S. PATENT DOCUMENTS 4,654,248 A * 3/1987 Mohammed ................ 428/137
6,281,573 B1 * 8/2001 Atwood et al. .............. 257/706
6,516,513 B2 * 2/2003 Milkovich et al. ............ 29/830
6,610,934 B2 * 8/2003 Yamaguchi et al. ......... 174/264
6,774,315 B1 * 8/2004 Pierson et al. .............. 174/261
6,791,178 B2 * 9/2004 Yamaguchi et al. ........ 257/699
6,899,960 B2 * 5/2005 Shi et al. .................... 428/620

* cited by examiner

*Primary Examiner*—Alonzo Chambliss
(74) *Attorney, Agent, or Firm*—Blakely, Sokoloff, Taylor & Zafman LLP

(57) ABSTRACT

A substrate and a method of making a substrate having a functionally gradient coefficient of thermal expansion are described herein. A system having a silicon die, an organic package substrate, and a substrate having a functionally gradient coefficient of thermal expansion, connecting the silicon die and the organic substrate is also described. The coefficient of thermal expansion at the upper surface of the substrate matches the coefficient of thermal expansion of the die, the coefficient of thermal expansion at the lower surface of the substrate matches the coefficient of thermal expansion of the package substrate, and the substrate has one or more coefficients of thermal expansion between the coefficients of thermal expansion of the upper and lower surfaces.

27 Claims, 7 Drawing Sheets

FIG. 7

SUBSTRATE HAVING A FUNCTIONALLY GRADIENT COEFFICIENT OF THERMAL EXPANSION

FIELD OF THE INVENTION

The present invention relates to packaging, and in particular, to a ceramic substrate.

BACKGROUND OF THE INVENTION

Integrated circuits are usually manufactured on wafer substrates. The wafer substrate is then "diced" or "singulated" into individual dies, each die carrying a respective integrated circuit. The die is then mounted on a package substrate, often with an intermediate interposer substrate. The substrate or substrates provide structural rigidity to the resulting integrated circuit package. The package substrate may be mounted to a board, such as a motherboard.

Some package and interposer substrates are formed from ceramic materials. Ceramic interposer substrates and other ceramic substrates are made of a plurality of green sheet laminations, all of the green sheets having the same material characteristics. Each of the green sheets have the same coefficient of thermal expansion (CTE), which is a value intermediate to the CTE of the die and the CTE of the substrate or motherboard the ceramic substrate or interposer is connecting.

The die and package substrate are mechanically and electrically connected at interconnection members. Typically, the interconnection members are provided in a Controlled Collapse Chip Connection (C4) configuration, which is an array of multiple solder joints for connecting the package substrate and the die. Surface tension forces of the liquid solder support the weight of the die and control the height (collapse) of the joint. However, thermal expansivity mismatch between the die and package substrate causes a shear displacement to be applied at each of the interconnection members, which can lead to accumulated plastic deformation and eventual failure of the low-k ILD (low dielectric constant interlayer dielectric) in the die and of the package system at the interconnection members. In some cases, prior art systems have accommodated for this stress by providing underfill in the gap between the die and package substrate. But, providing underfill in the gap between the die and package substrate does not prevent failure and increases cost and manufacturing time.

BRIEF DESCRIPTION OF THE DRAWINGS

The invention may best be understood by referring to the following description and accompanying drawings that are used to illustrate embodiments of the invention. In the drawings.

DETAILED DESCRIPTION OF THE PREFERRED EMBODIMENTS

The following detailed description presents various specific embodiments of the present invention. However, the present invention can be embodied in a multitude of different forms as defined and covered by the claims. In this description, reference is made to the drawings wherein like parts are designated with like numerals throughout.

A substrate, such as a package substrate or an interposer substrate, having a gradient coefficient of thermal expansion (CTE) is described herein. Connection of the substrate having a gradient CTE to a die and another substrate or motherboard to reduce thermomechanical stress at the interconnection members is also described herein. Methods of making and using the substrate are also described herein.

The CTE gradient refers to a plurality of CTE's, the plurality of CTE's incrementally increasing or decreasing between the upper and lower surfaces of the substrate. The CTE's of the layers are selected to reduce the shear force and displacement at the interconnection members due to the thermal expansivity mismatch, increasing reliability at the interconnection members and reducing the dependence on underfill for interconnection reliability. Thus, stress due to failure at the interconnection members is shifted to and absorbed by the substrate having a gradient CTE.

Figure 1:
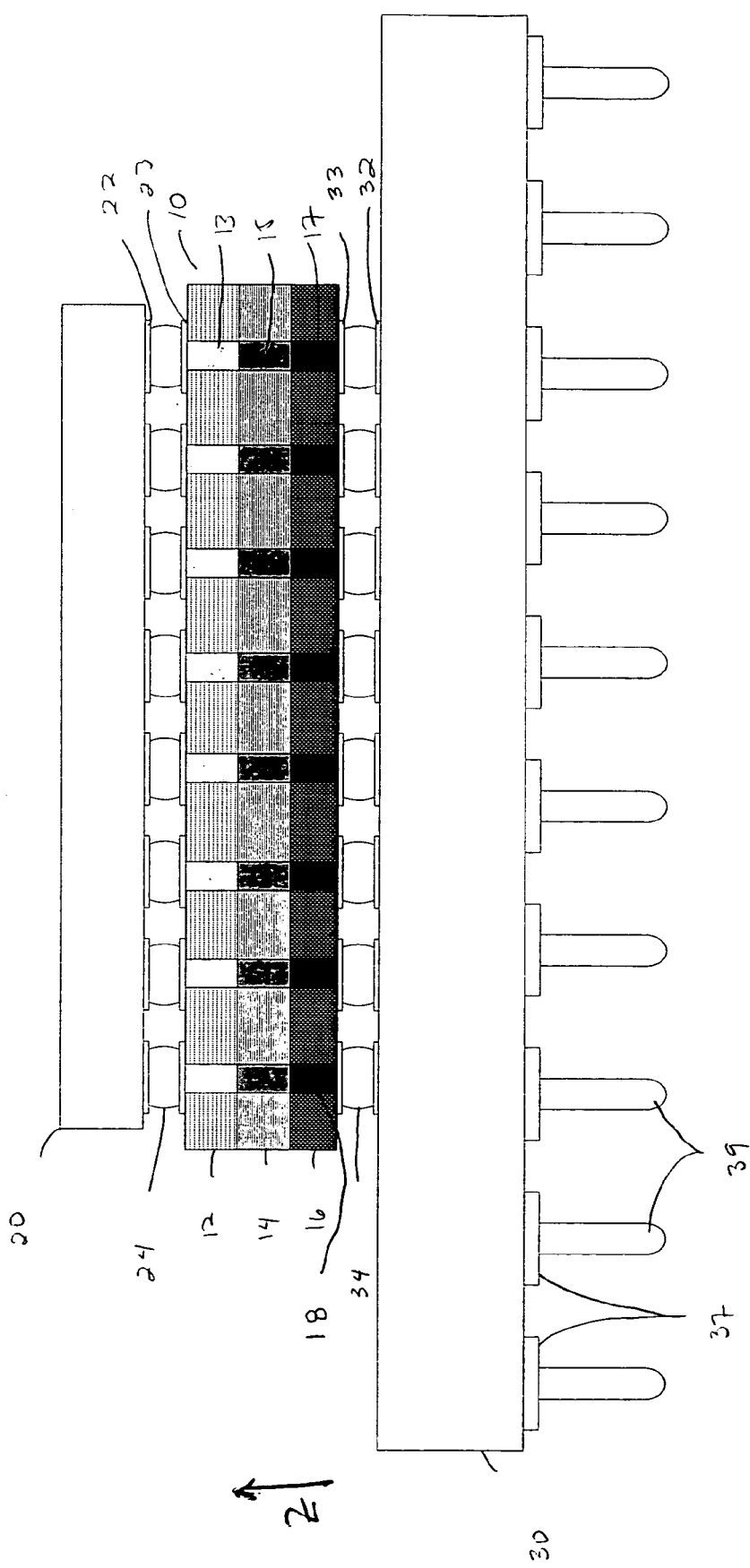
FIG. 1 is a cross-sectional side view of a substrate connecting a first device and a second device in accordance with one embodiment of the present invention.

With reference to FIG. 1, a substrate 10 is shown connecting a first device 20 and a second device 30.

In some embodiments, first device 20 is a die having an integrated circuit at a lower surface thereof. In some embodiments, first device 20 is silicon. In some embodiments, second device 30 may be a package substrate, a motherboard, or a printed circuit board (PCB). In some embodiments, second device 30 is another ceramic substrate. In some embodiments, second device 30 is plastic. In some embodiments, second device 30 is a PCB of a plastic package substrate.

The first device 20 may include an integrated circuit formed in a lower surface thereof. A plurality of contact pads 22 are formed on a lower surface of the first device 20 and are electrically and mechanically connected to the integrated circuit. Each one of the contact pads 22 matches up with a respective contact pad 23 on an upper surface of the substrate 10. The contact pads 22 of first device 20 are connected to the contact pads 23 of substrate 10 by a respective one of conductive interconnection members 24.

A plurality of contact pads 32 are also provided on an upper surface of the substrate 30. Each one of the contact pads 32 on the upper surface of second device 30 matches up with a respective one of the contact pads 33 on substrate 10. Conductive interconnection members 34 interconnect contact pads 32 of second device 30 with contact pads 33 of substrate 10 to mechanically and electrically connect substrate 10 and second device 30. In some embodiments, the second device 30 also has a plurality of contact pads 37 on a lower surface of the substrate 30 and corresponding interconnection members 39 for connecting second device 30 to any another device, such as, for example, a board.

In some embodiments, the conductive interconnection members 24, 34, 39 are solder balls connections, wirebond connections, tape automated bonding (TAB) connections or C4 connections. In some embodiments, interconnection member 24, 34, 39 are ball grid array (BGA) connections. In some embodiments, interconnection members 24, 34, 39 are copper. In some embodiments, interconnections members 39 are I/O connections, such as through-hole and surface mounted connections. Interconnection members 39 may also be pins or land grid array (LGA) connections.

Substrate 10 includes an upper layer 12, an intermediate layer 14, and a lower layer 16. A plurality of conductive vias 18 extend through each of the layers 12, 14, 16.

The CTE of layers 12, 14, 16 gradually vary to create a CTE gradient between the upper and lower surfaces (in the z-direction) of substrate 10. That is, the CTE of the substrate is incrementally increased or decreased between the upper and lower surfaces of the substrate by forming each layer 12, 14, 16, such that each one of the layers 12, 14, 16 has a different CTE corresponding therewith. The difference in CTE values between each of the adjacent layers generates the gradient, and the CTE's may be selected to reduce stress due to thermal expansivity mismatch within the die, the substrate and at interconnection members 24, 34.

By varying the material composition and characteristics between the upper and lower surfaces of the substrate, as will be described herein with reference to FIG. 6, a substrate having incrementally increasing or decreasing CTE's between the upper and lower surfaces of the substrate may be formed according to the CTE gradient. In some embodiments, substrate 10 is ceramic, a glass-ceramic, or a non-ceramic.

In some embodiments, the CTE of the layers 12, 14, 16 is any value or range of values between about $3.0 \times 10^{-6}/^\circ$ C. and about $18.0 \times 10^{-6}/^\circ$ C.

In some embodiments, the CTE of upper layer 12 matches the CTE of the first device 20 and the CTE of the lower layer 16 matches the CTE of the second device 30 to reduce stress due to thermal expansivity mismatch at interconnection members 24, 34, and the CTE of the intermediate layer 14 is intermediate of the CTE of the upper layer 12 and the CTE of the lower layer 16 to reduce stress due to thermal expansivity mismatch within the substrate. For example, in one embodiment, upper layer 12 has a CTE of about $3-4 \times 10^{-6}/^\circ$ C., matching the CTE of a silicon die, and lower layer 16 has a CTE of about $16-18 \times 10^{-6}/^\circ$ C., matching the CTE of an organic package substrate, and intermediate layer 14 has a CTE having any value or range of values between about 3 and about $18 \times 10^{-6}/^\circ$ C., and in one embodiment, intermediate layer 14 has a CTE of about $9-11 \times 10^{-6}/^\circ$ C.

Each contact pad 23, 33 of substrate 10 is located on and mechanically and electrically connected to a respective one of the plurality of conductive vias 18. In some embodiments, vias 18 have a CTE gradient similar to or matching the CTE gradient of substrate 10 to reduce stress due to thermal expansivity mismatch within the substrate and at interconnection members 24, 34. Plurality of vias 18 each include an upper conductive via 13, an intermediate conductive via 15 and a lower conductive via 17. The CTE of the vias 18 is incrementally increased or decreased between the upper and lower surfaces of the substrate by forming each via 13, 15, 17, such that each one of the vias 13, 15, 17 has a different CTE corresponding therewith.

In some embodiments, the CTE of upper via 13 of vias 18 matches the CTE of layer 12 of substrate 10; the CTE of intermediate via 15 of vias 18 matches the CTE of layer 14 of substrate 10; and the CTE of lower via 17 of vias 18 matches the CTE of layer 16 of substrate 10. For example, in one embodiment, the CTE of both layer 12 of the substrate and upper via 13 of the vias 18 is about $3-4 \times 10^{-6}/^\circ$ C., the CTE of both intermediate layer 14 of the substrate and intermediate via 15 of the vias 18 is about $9-11 \times 10^{-6}/^\circ$ C., and the CTE of both lower layer 16 of the substrate and lower via 17 of the vias 18 is about $16-18 \times 10^{-6}/^\circ$ C.

In some embodiments, the CTE of the vias 13, 15, 17 is any value or range of values between about $3.0 \times 10^{-6}/^\circ$ C. and about $18.0 \times 10^{-6}/^\circ$ C.

Typically, vias 18 are formed from a conductive material, such as copper, silver, or an alloy of tungsten and molybdenum. By varying the material composition and characteristics of the metallic paste used to form vias 13, 15, 17 of vias 18 between the upper and lower surfaces of the substrate, the CTE gradient of the vias can be matched to the CTE gradient of the substrate to reduce stress due to thermal expansivity mismatch within the substrate and at the interconnection members, as will be described further herein with reference to FIG. 6.

The vias 18 include power, ground and signal conductive vias. In some embodiments, other electrical connections, such as conductive lines, and power and ground planes are provided within substrate 10.

Typically, the thickness of each one of layers 12, 14, 16 (and vias 13, 15, 17) is any value or range of values between about 25 and about 250 microns, and the total thickness of the substrate is between about 150 and about 1000 microns. In one embodiment, the thickness of each one of layers 12, 14, 16 is about 100 microns, and the total thickness of substrate 10 is about 500 microns.

Figure 2:
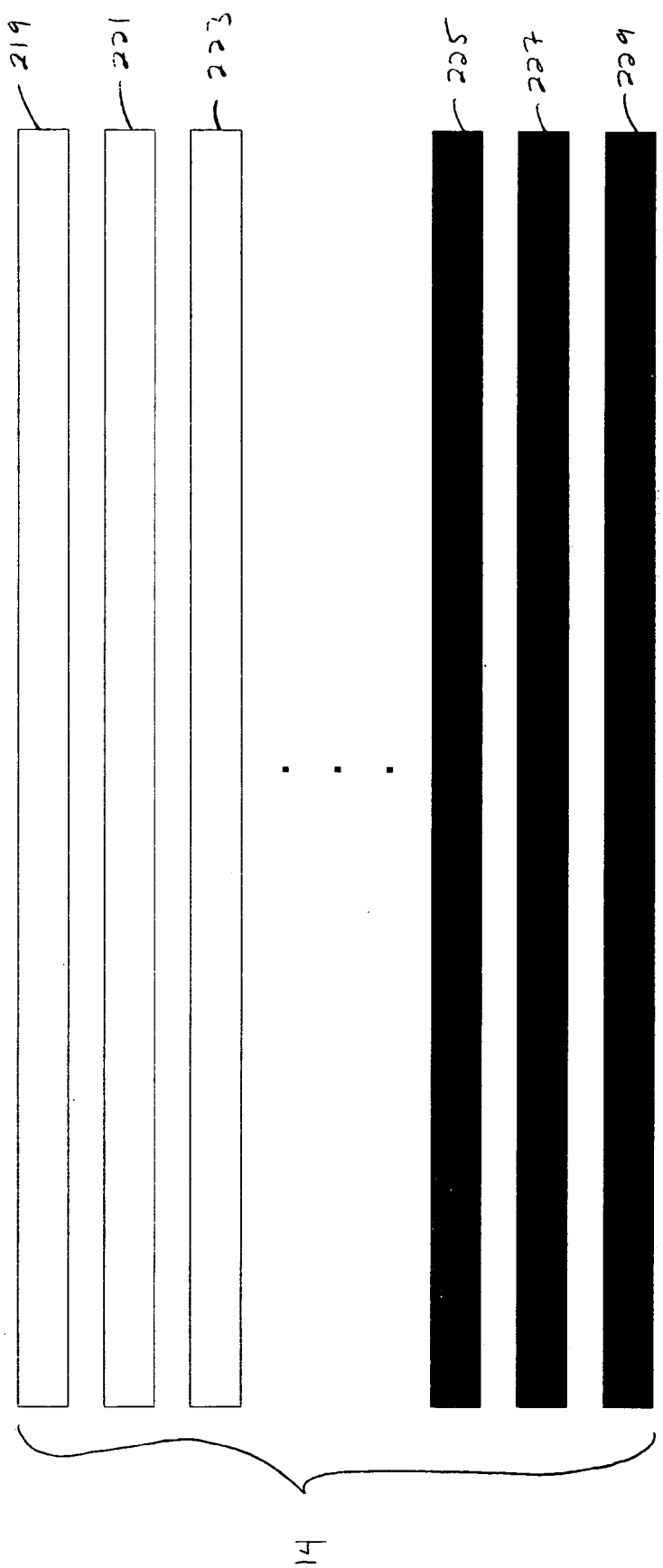
FIG. 2 is a schematic detailed side view of the substrate illustrated in FIG. 1.
Figure 3:
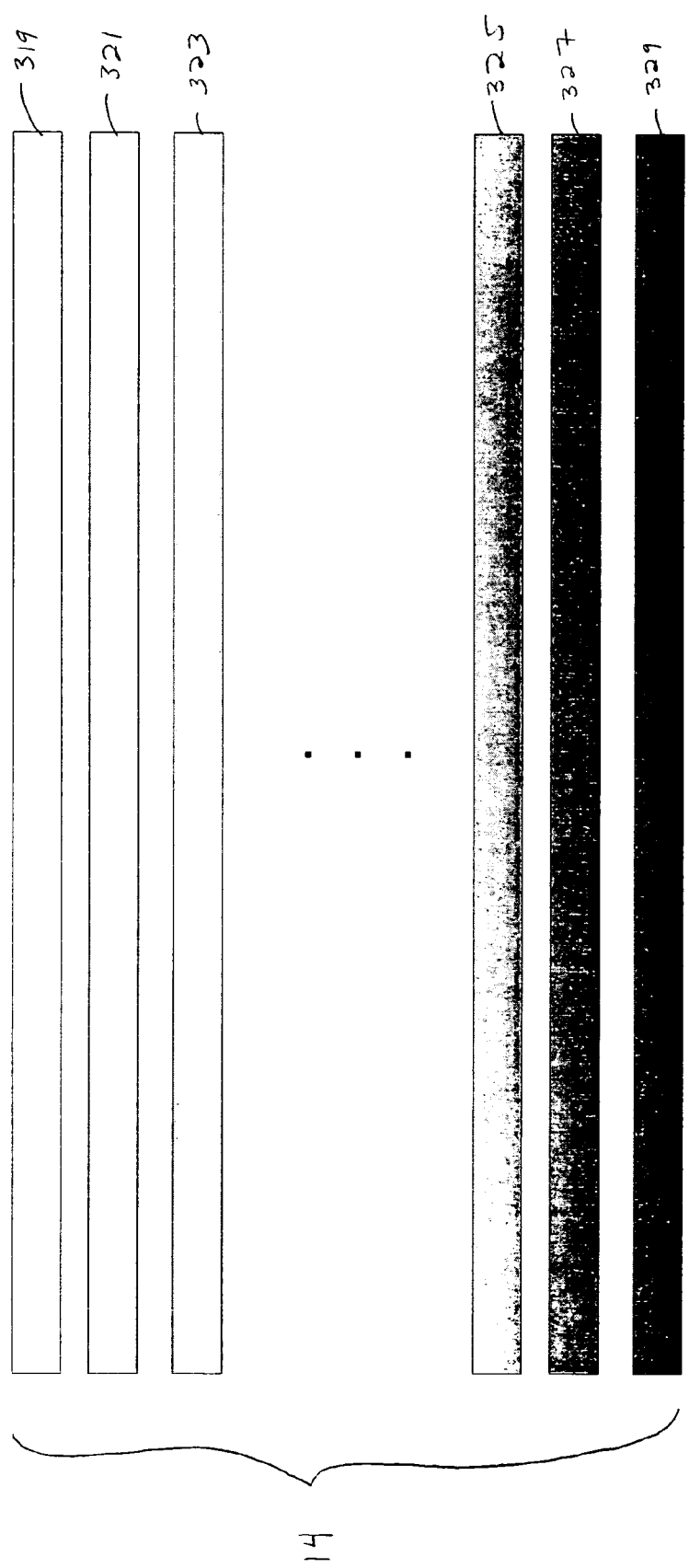
FIG. 3 is a schematic detailed side view of the substrate illustrated in FIG. 1.

In some embodiments, substrate 10 includes a plurality of layers, as illustrated in FIGS. 2 and 3. Layer 14 is shown in FIGS. 2 having a plurality of layers 219, 221, 223, . . . 225, 227, 229. Layer 14 may include more or less than the six layers presently illustrated.

In some embodiments, as shown in FIG. 2, the CTE gradient is uniform to reduce abrupt changes in stress due to thermal expansivity mismatch within the substrate. That is, the difference between the CTE for each of the adjacent layers is uniform throughout the thickness of the substrate 10. In some embodiments, the difference between the CTE for each of the adjoining layers (i.e., the difference between layers 219 and 221, the difference between layers 221, 223, and so on) is any value or range of values between about $1 \times 10^{-6}/^\circ$ C. and about $5 \times 10^{-6}/^\circ$ C.

For example, in one embodiment, the difference in CTE between each layer is about $1 \times 10^{-6}/^\circ$ C., such that the CTE of intermediate layer 219 is about $5 \times 10^{-6}/^\circ$ C., the CTE of intermediate layer 221 is about $6 \times 10^{-6}/^\circ$ C., the CTE of intermediate layer 223 is about $7 \times 10^{-6}/^\circ$ C., . . . the CTE of intermediate layer 239 is about $15 \times 10^{-6}/^\circ$ C., the CTE of intermediate layer 241 is about $16 \times 10^{-6}/^\circ$ C., and the CTE of intermediate layer 243 is about $17 \times 10^{-6}/^\circ$ C. In another embodiment, for example, the difference in CTE between each adjacent layer is about $2 \times 10^{-6}/^\circ$ C., such that the CTE of intermediate layer 219 is about $5 \times 10^{-6}/^\circ$ C., the CTE of intermediate layer 221 is about $7 \times 10^{-6}/^\circ$ C., the CTE of intermediate layer 223 is about $9 \times 10^{-6}/^\circ$ C., the CTE of intermediate layer 225 is about $11 \times 10^{-6}/^\circ$ C., the CTE of intermediate layer 227 is about $13 \times 10^{-6}/^\circ$ C., the CTE of intermediate layer 229 is about $15 \times 10^{-6}/^\circ$ C. In some embodiments, the difference non-integrally increases and decreases from the top to the bottom.

Layer 14 is shown in FIGS. 3 having a plurality of layers 319, 321, 323, . . . 325, 327, 329. Layer 14 may include more or less than the six layers presently illustrated.

In some embodiments, as shown in FIG. 3, the CTE gradient is variable so that the largest stress due to thermal expansivity mismatch is at or near the center of the substrate, optimizing stress reduction at the upper and lower surfaces of the substrate. That is, the difference between the CTE for each of the adjacent layers (i.e., the difference between layers 319 and 321, the difference between layers 321, 323, and so on) varies throughout the thickness of the substrate 10. Hence, the difference between the CTE for each adjoining layer is greater in the middle and smaller near the upper and lower surfaces of the substrate 10 so that stress due to thermal expansivity mismatch is concentrated at the center of substrate 10, as opposed to interconnection members 24, 34 and the upper and lower surfaces of substrate 10.

For example, in one embodiment, the CTE of intermediate layer 319 is about $4.25 \times 10^{-6}/°$ C., the CTE of intermediate layer 321 is about $4.5 \times 10^{-6}/°$ C., the CTE of intermediate layer 323 is about $5 \times 10^{-6}/°$ C., . . . the CTE of intermediate layer 325 is about $16 \times 10^{-6}/°$ C., the CTE of intermediate layer 327 is about $17.5 \times 10^{-6}/°$ C., and the CTE of intermediate layer 329 is about $17.75 \times 10^{-6}/°$ C., when the CTE of the upper layer 12 is about $4 \times 10^{-6}/°$ C. and the CTE of the lower layer 16 is about $18 \times 10^{-6}/°$ C.

Figure 4:
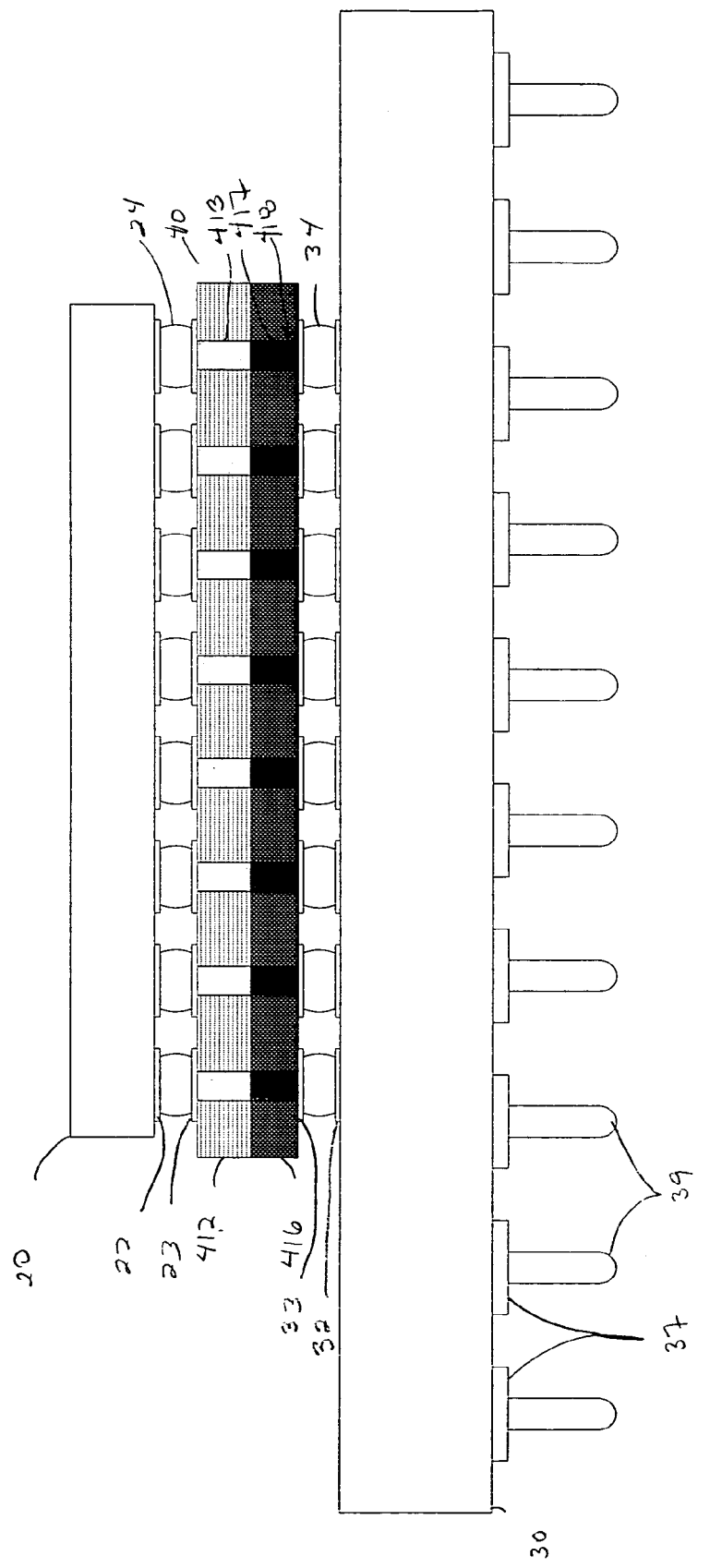
FIG. 4 is a schematic cross-sectional side view of a substrate connecting a first device and a second device in accordance with one embodiment of the present invention.

FIG. 4 shows a substrate 410 connecting first device 20 and second device 30. Substrate 410 includes two layers 412, 416, and a plurality of vias 418.

In some embodiments, each of the two layers 412, 416 has a CTE intermediate the CTE's of the first device 20 and second device 30, but different from one another. For example, in one embodiment, the CTE of upper layer 412 is about $7 \times 10^{-6}/°$ C. and the CTE of lower layer 416 is about $13 \times 10^{-6}/°$ C., when the second device 30 has a CTE of about $18 \times 10^{-6}/°$ C. and the first device 20 has a CTE of about $4 \times 10^{-6}/°$ C.

In some other embodiments, upper layer 412 has a CTE matching the CTE of the first device 20, and lower layer 416 has a CTE matching the CTE of the second device 30. For example, in one embodiment, the CTE of upper layer 412 is about $4 \times 10^{-6}/°$ C., matching the CTE of the first device 20, which, in one embodiment, is a silicon die, and the CTE of lower layer 416 is about $18 \times 10^{-6}/°$ C., matching the CTE of the second device 30, which, in one embodiment, is an organic package substrate.

In some embodiments, vias 418 have a CTE gradient similar to or matching the CTE gradient of substrate 410 to reduce stress due to thermal expansivity mismatch within the substrate and at interconnection members 24, 34. Vias 418 include an upper via 413 and a lower via 417. In some embodiments, the CTE of upper via 413 of vias 418 matches the CTE of upper layer 412 of substrate 410, and the CTE of lower via 417 of vias 418 matches the CTE of lower layer 416 of substrate 410.

Figure 5:
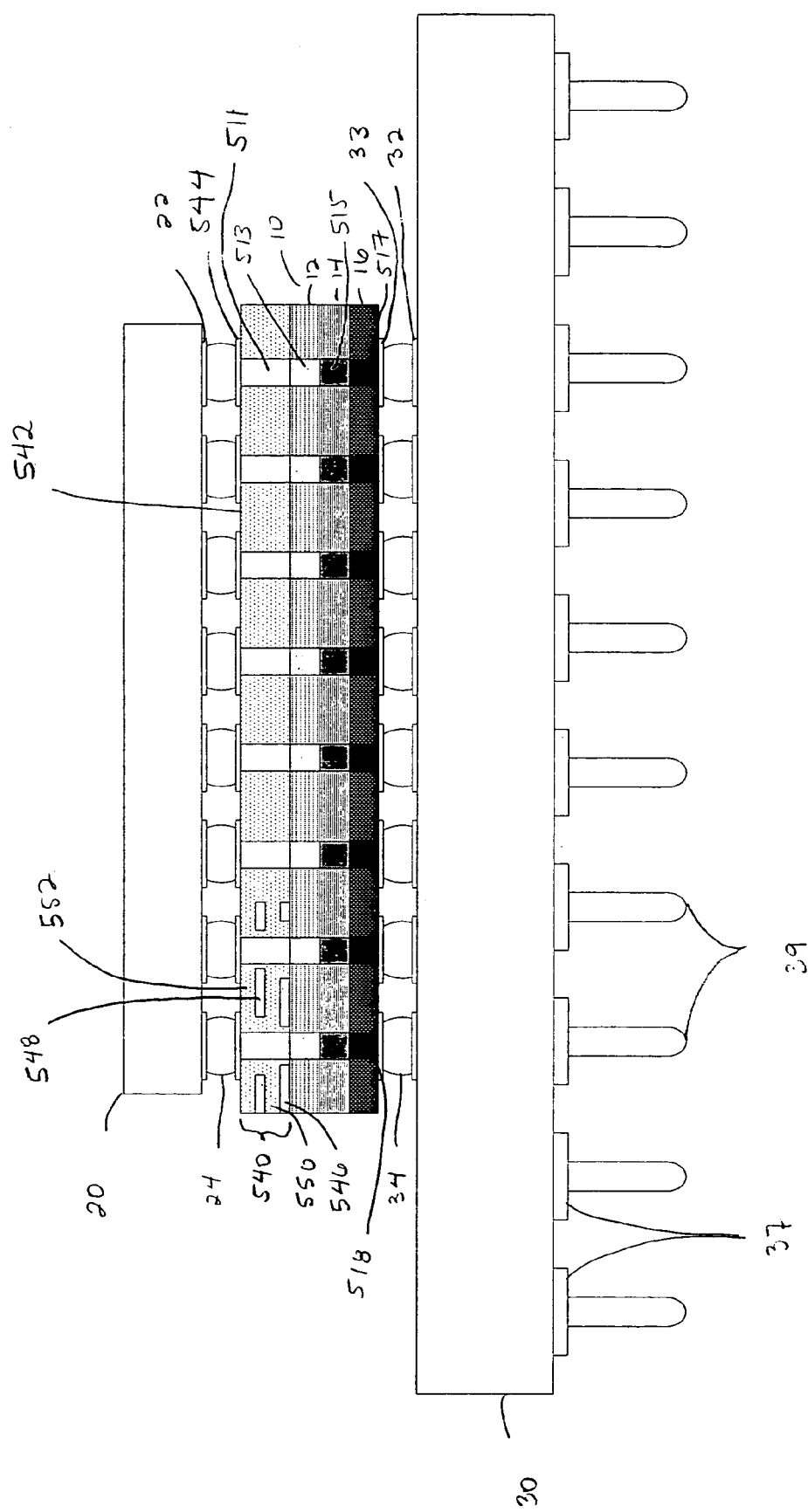
FIG. 5 is a schematic cross-sectional side view of a substrate having a thin-film capacitor in accordance with one embodiment of the present invention.

Referring to FIG. 5, substrate 10 having a thin film capacitor is shown in accordance with one embodiment of the present invention. Substrate 10 is connected to first device 20 and substrate 30 at interconnection members 24 and 34, respectively, as described above with reference to FIG. 1.

Substrate 10 also includes a capacitor structure 540 having a high k-value dielectric material, a low k-value dielectric material 542, and contact pads 544.

The low k-value dielectric material 542 is formed over the entire upper surface of the upper layer 12. The low k-value dielectric material 542 thus covers the power, ground and signal via openings. The low k-value dielectric material 542 is typically made of silicon dioxide, which as a dielectric constant of between three and four. The low-k dielectric material is polished to obtain a flat surface on which the thin layers of the thin film capacitor may be deposited.

The low k-value dielectric material 542 is subsequently patterned. The low k-value dielectric material 542 may for example be patterned by first covering a portion thereof and then burning exposed portions away. The portions that are burned away are portions thereof located over the power and ground via openings. Openings are also burned in the low k-value dielectric material 542, so that the signal via openings extend vertically through the low k-value dielectric material.

The capacitor structure 540 is then formed on the upper surface of the upper layer 12 where the low k-value dielectric material 542 has been patterned. That is, the capacitor structure 540 is formed on an area of the upper surface of the substrate 10 that has the power and ground via openings. The capacitor structure 540 includes power and ground planes 546 and 548 and a dielectric layer 550. In some embodiments, other electrical connections, such as conductive lines, are also provided. The power and ground planes are typically made of nickel, copper or platinum. The dielectric layer 550 is made of a high k-value dielectric material which may have a dielectric constant of between 300 and 900, although the dielectric constant may be as high as 5000. An insulating layer 552 is formed on top of the ground plane 548. The insulating layer 552 may be the same material as the dielectric layer 550. The layers and planes 542, 546, 548, 550 and 552 are all patterned so that the power and ground via openings extend vertically through the entire capacitor structure 540. The manufacture of thin film capacitor structures, such as capacitor structure 540, is known in the art.

The contact pads 544 are then formed on the capacitor structure 540 and the low k-value dielectric material 542. Each contact pad 544 is located on and electrically connected to a respective one of the conductive vias.

Power and ground planes 546, 548 of capacitor 540 are connected to vias 518 of substrate 10. Substrate 10 has a CTE gradient and includes a plurality of layers 12, 14, 16, and a plurality of conductive vias 18, as described hereinabove. In some embodiments, the CTE gradient is uniform, while in other embodiments, the CTE gradient is variable.

Vias 518 may also have a CTE gradient, similar to or matching the CTE gradient of substrate 10 to reduce stress due to thermal expansivity mismatch within the die, substrate and at interconnection members 24, 34. Vias 518 may include a capacitor via 511, upper via 513, an intermediate via 515, and a lower via 517. In some embodiments, the CTE of capacitor via 511 matches the CTE of capacitor 540, the CTE of upper via 513 matches the CTE of upper layer 12 of substrate 10, the CTE of intermediate via 515 matches the CTE of intermediate layer 14, and the CTE of lower via 517 matches the CTE of lower layer 16.

The CTE of the capacitor 540 is close to that of substrate 10 at its upper surface. In some embodiments, the CTE of upper layer 12 matches the CTE of the capacitor 540, and the CTE of the intermediate and lower layers 14, 16 incrementally increase until the lower layer 16 matches the CTE of the second device 30 to reduce stress at interconnects 24, 34, within substrate 10, and device 20 caused by thermal expansivity mismatch.

Figure 6:
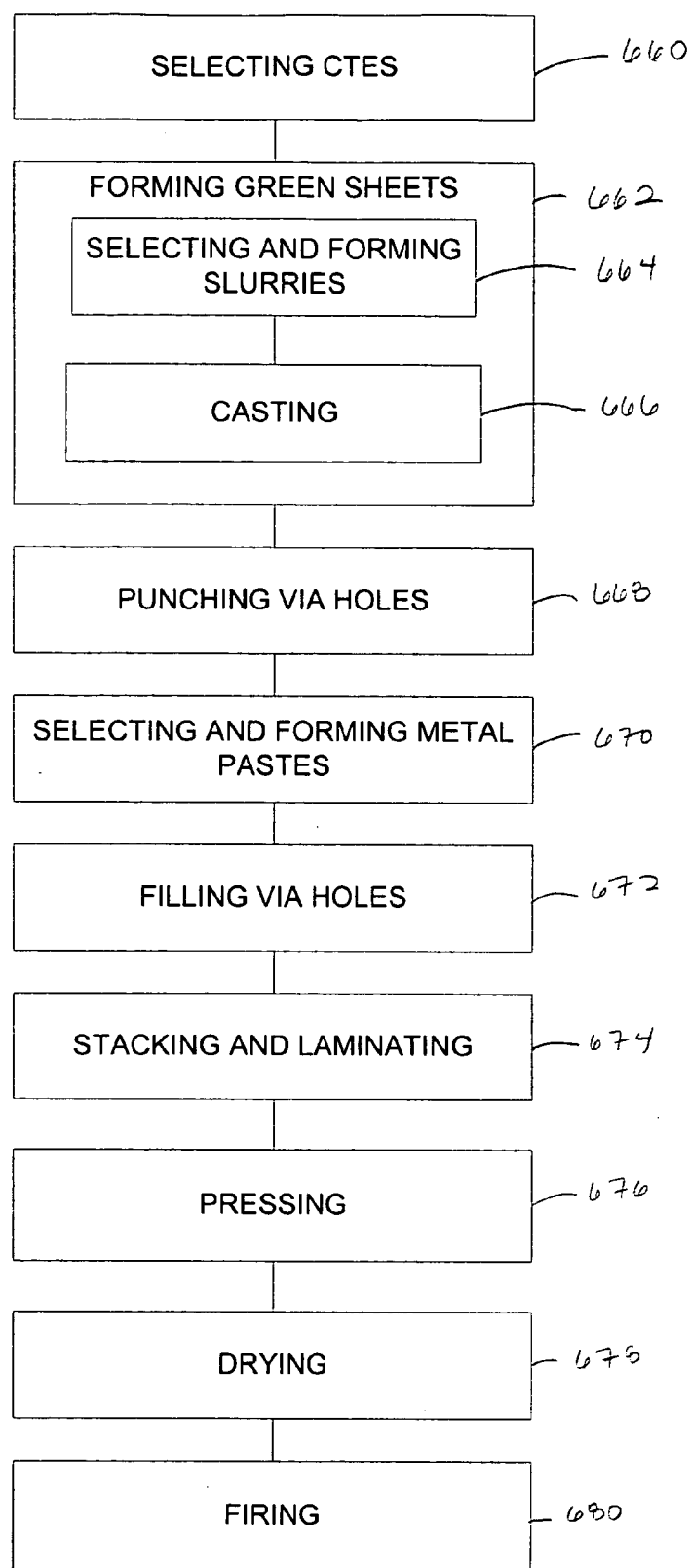
FIG. 6 is a flow diagram of a process of making a substrate in accordance with one embodiment of the present invention.

Referring to FIG. 6, a method of making a substrate having a gradient CTE is shown in accordance with one embodiment of the present invention.

The process begins with selecting the CTE's of the substrate to form the gradient CTE (block 660). The CTE's of the substrate are selected taking into account the CTE of the materials the substrate is connecting. For example, in one embodiment, the CTE's of the substrate are selected based on the substrate connecting the first device, a silicon semiconductor die, to the second device, an organic package substrate, as discussed hereinabove. Once the CTE's of the upper and lower surfaces of the substrate have been selected, one or more CTE's may be selected to be intermediate the CTE's of the upper and lower surfaces of the substrate. The CTE's are also selected by identifying locations where maximum stress is present in the substrate, and designing the substrate to reduce the stresses, particularly at the upper and lower surfaces of the substrate. Thus, the stress is shifted into the substrate. In some embodiments, it is desirable to have the largest stress at or near the center of the substrate. In some embodiments, it is desirable to reduce abrupt changes in stress within the substrate.

In some embodiments, the CTE's are selected such that the CTE gradient of the substrate is uniform, while in some other embodiments, CTE's are selected such that the CTE gradient of the substrate is variable.

The substrate is initially formed from a plurality of green, unfired materials in the form of green sheets (block 662). Upon selecting the CTE's of the substrate, slurries having the desired CTE's are formed.

The green sheets are formed from the slurries, which are formed from raw materials, such as, but not limited to, binders, solvents, plasticizers, ceramic powders, glass, and the like (block 664). The ceramic powders include $Al_2O_3$, BaO, CaO, $B_2O_3$, $SiO_2$, SiC, AlN, $Si_3N_4$, and the like, and possible combinations thereof. Each of the ceramic powders has a CTE associated therewith. The glass includes borosilicate glasses, calcia-magnesia-alumina silicate glasses, and the like, and combinations thereof. The binders include polyvinyl butyral (PVB), polyvinyl acetate, polymethyl methacrylate (PMMA), polyisobutylene (PIB), polyalphametyl stryrene (PAMS), nitrocellulose, cellulose acetate, cellulose acetate butyral, and the like. The solvents include acetic acid, acetone, n-butyl alcohol, butyl acetate, carbon tetrachloride, cyclohexanone, diacetone alcohol, dioxane (1,4), ethyl alcohol (95%), ethyl acetate (85%), ethyl cellosolve, ethylene chloride, isophoronet, isopropyl alcohol (95%), isopropyl acetate, methyl alcohol, methyl acetate, methyl cellosolve, methyl ethyl ketone, methyl isobutyl ketone, pentoxol, pentoxone, propylene dichloride, toluene, toluene ethyl alcohol (95%), and the like. The plasticizers include phthalate, phosphate, polyester, sabacate, citrate, petroleum, ricinoleate, rosin derivatives, polyethylene glycol ether, glyceryl mono oleate, and the like.

By varying the quantities of the ceramic powders and/or glass in the slurries, each having a CTE associated therewith, the CTE of the green sheets are varied. Glass-ceramics with a CTE of about $4 \times 10^{-6}/°$ C. and $18 \times 10^{-6}/°$ C. are commercially available.

The slurries are casted to form the green sheets (block 666). Green sheet casting is known in the art. A plurality of green sheets, having a plurality of CTE's associated therewith, are thus formed. In some embodiments, a plurality of green sheets form each layer 12, 14, 16 of the substrate, while in other embodiments, each green sheet forms a layer of the substrate.

The process continues by punching one or more via holes in the green sheets (block 668). The via holes extend from the lower surface to the upper surface of the substrate, as described above with reference to FIG. 1. Green sheet punching is known in the art.

In some embodiments, the process continues by preparing a plurality of metal pastes (block 670). Each of the metal pastes has a different CTE value. Metal pastes having differing CTE values are formed by changing the materials and quantities of materials in the paste, such as the type and quantity of each of the glass, metal powder, resin and solvent.

In some embodiments, the process continues by filling the via holes with a conductive material, such as, for example, a metal paste (block 672). In some embodiments, the CTE gradient of the vias is matched to the CTE gradient of the substrate 10. The via holes of each green sheet may be filled with a metal paste having a CTE matching the CTE of the corresponding green sheet.

This process is further illustrated in FIG. 7. FIG. 7A shows a first green sheet layer 712, which has a first CTE. FIG. 7B shows a via hole 707 punched in green sheet 712. The via hole 707 is filled with a metal paste composition having a CTE matching the first CTE of green sheet layer 712 to form via layer 713, as illustrated in FIG. 7C. FIG. 7D shows a second green sheet layer 714, which has a second CTE. FIG. 7E shows a via hole 709 punched in green sheet layer 714. The via hole 709 is filled with a metal paste composition having a CTE matching the second CTE of green sheet layer 714 to form via layer 715, as illustrated in FIG. 7F. A third green sheet layer 716, which has a third CTE value is shown in FIG. 7F. A via hole 711 is punched in green sheet layer 716 as shown in FIG. 7H. Via hole 711 is filled with a metal paste composition having a CTE matching the third CTE of green sheet layer 716 to form via layer 717, as illustrated in FIG. 7I.

Referring back to FIG. 6, the process continues by stacking and laminating together the green sheet layers to obtain the selected gradient (block 674). Green sheet stacking and laminating are known in the art.

Figure 7A:
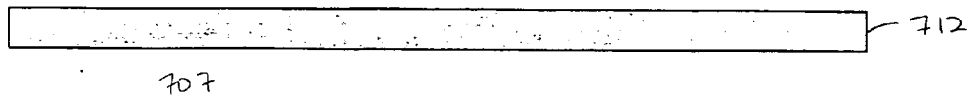
FIGS. 7A–7J are schematic cross-sectional side views of a method of making a substrate in accordance with one embodiment of the present invention.
Figure 7B:
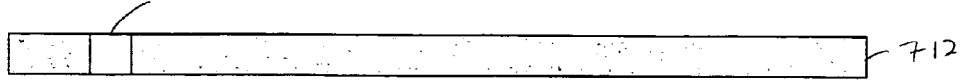
Figure 7C:
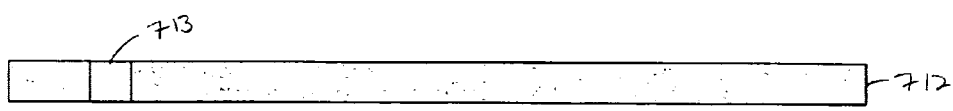
Figure 7D:
Figure 7E:
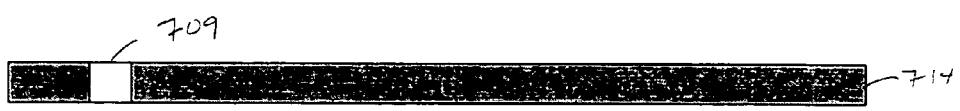
Figure 7F:
Figure 7G:
Figure 7H:
Figure 7I:
Figure 7J:
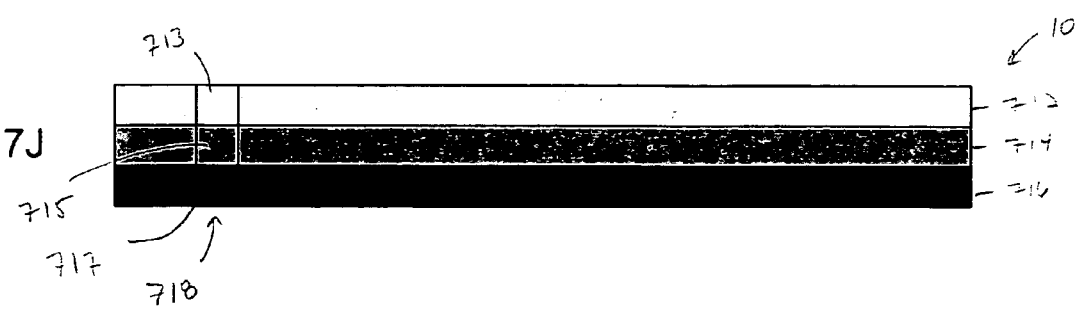

With reference again to FIG. 7, the green sheet layers 712, 714, 716 having filled vias 713, 715, 717 are stacked and laminated to form a substrate 10 having a plurality of layers 712, 714, 716, as shown in FIG. 7J. The plurality of layers 712, 714, 716 form the CTE gradient. The substrate 710 includes at least one via 718, having a plurality of layers 713, 715, 717, the CTE of layers 713, 715, 717 matching the CTE of layers 712, 714, 716, respectively.

Referring back to FIG. 6, the process continues by pressing (block 676) and drying (block 678) the green sheet layers. Green sheeting pressing and drying are known in the art.

The stacked and laminated green sheets are fired to form the substrate having the selected gradient CTE (bock 680). In some embodiments, the metal paste in the via holes is fired simultaneously (i.e., co-fired) with the green sheet layers. Firing and co-firing of ceramic substrates is known in the art.

In some embodiments, a thin film capacitor is formed on the substrate, as described herein with reference to FIG. 5.

In some embodiments, the green sheets are metallized to provide additional electrical connections. Metallization of green sheets is known in the art. Substrate 10 may also be brazed to provide I/O connections. Substrate brazing is known in the art.

In use, a ceramic substrate having a CTE gradient is connected to a first device and a second device, as discussed herein with reference to FIG. 1, to reduce stress due to thermal expansivity mismatch at the connections thereof within the substrate and the die.

Although the present invention has been described in terms of certain preferred embodiments, other embodiments of the invention including variations in dimensions, configuration and materials will be apparent to those of skill in the art in view of the disclosure herein. In addition, all features discussed in connection with any one embodiment

What is claimed:

1. An apparatus, comprising:
   a first device having a first coefficient of thermal expansion;
   a second device having a second coefficient of thermal expansion; and
   a substrate connecting the first device and the second device, the substrate having a coefficient of thermal expansion gradient, wherein the substrate comprises a via extending from an upper surface of the substrate to a lower surface of the substrate, and wherein the coefficient of thermal expansion of the via matches the coefficient of thermal expansion gradient of the substrate.

2. The apparatus of claim 1, wherein the second device is selected from the group consisting of a ceramic substrate, a package substrate, an organic package substrate, a motherboard, and a printed circuit board.

3. The apparatus of claim 1, wherein the first device is an integrated circuit.

4. The apparatus of claim 3, wherein the integrated circuit is formed from silicon.

5. The apparatus of claim 1, wherein the substrate comprises a plurality of layers, and wherein the plurality of layers comprise an upper layer having a third coefficient of thermal expansion, an intermediate layer having a fourth coefficient of thermal expansion, a lower layer having a fifth coefficient of thermal expansion, the fourth coefficient of thermal expansion being intermediate the third coefficient of thermal expansion and the fifth coefficient of thermal expansion.

6. The apparatus of claim 5, wherein the intermediate layer comprises a plurality of layers, each of the plurality of layers having a coefficient of thermal expansion between the third coefficient of thermal expansion and the fifth coefficient of thermal expansion.

7. The apparatus of claim 5, wherein the third coefficient of expansion matches the first coefficient of expansion, and wherein the fifth coefficient of expansion matches the second coefficient of expansion.

8. The apparatus of claim 1, wherein the gradient is uniform.

9. The apparatus of claim 1, wherein the gradient is variable.

10. The apparatus of claim 1 wherein the difference between coefficients of thermal expansion is between about $1 \times 10^{-6}/°$ C. and about $5 \times 10^{-6}/°$ C.

11. The apparatus of claim 1, wherein the plurality of coefficients of thermal expansion of the plurality of layers are between the first coefficient of thermal expansion and the second coefficient of thermal expansion.

12. The apparatus of claim 1, wherein the difference between coefficients of thermal expansion is between about $0.25 \times 10^{-6}/°$ C. and about $5 \times 10^{-6}/°$ C.

13. The apparatus of claim 1, wherein the difference between coefficients of thermal expansion is greater at the center of the substrate than at the upper and lower surfaces of the substrate.

14. The apparatus of claim 1, wherein the ceramic substrate is a glass-ceramic substrate.

15. The apparatus of claim 1, wherein the substrate is a ceramic substrate.

16. An apparatus, comprising:
    a first device having a first coefficient of thermal expansion;
    a second device having a second coefficient of thermal expansion; and
    a substrate connecting the first device and the second device, the substrate having a plurality of layers, the plurality of layers having a corresponding plurality of coefficients of thermal expansion, wherein the difference between coefficients of thermal expansion is between about $0.25 \times 10^{-6}/°$ C. and about $5 \times 10^{-6}/°$ C.

17. The apparatus of claim 16, wherein the substrate comprises a via extending from an upper surface of the substrate to a lower surface of the substrate.

18. The apparatus of claim 17, wherein the coefficient of thermal expansion of the via matches the coefficient of thermal expansion gradient of the substrate.

19. The apparatus of claim 16, wherein the plurality of coefficients of thermal expansion of the plurality of layers are between the first coefficient of thermal expansion and the second coefficient of thermal expansion.

20. The apparatus of claim 16, wherein the first device is an integrated circuit provided in a silicon die and the second device is a plastic package substrate.

21. The apparatus of claim 16, wherein the substrate further comprises at least one via, the via having a plurality of layers having a corresponding plurality of coefficients of thermal expansion, the coefficients of thermal expansion of the at least one via matching the coefficients of thermal expansion of the substrate.

22. The apparatus of claim 16, wherein the difference between coefficients of thermal expansion is greatest at the center of the second substrate.

23. The apparatus of claim 16 wherein the first device is a silicon die and the second device is a plastic package substrate.

24. The apparatus of claim 16, wherein the difference between coefficients of thermal expansion of the plurality of layers varies.

25. The apparatus of claim 16, wherein the difference between coefficients of thermal expansion of the plurality of layers is uniform.

26. The apparatus of claim 16, wherein the ceramic substrate is a glass-ceramic substrate.

27. The apparatus of claim 16, wherein the substrate is a ceramic substrate.

* * * * *